US009007822B2

(12) United States Patent
Hendrickson (10) Patent No.: US 9,007,822 B2
(45) Date of Patent: Apr. 14, 2015

(54) COMPLEMENTARY DECODING FOR NON-VOLATILE MEMORY

(75) Inventor: Nicholas Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 390 days.

(21) Appl. No.: 13/616,545

(22) Filed: Sep. 14, 2012

(65) Prior Publication Data

US 2014/0078821 A1 Mar. 20, 2014

(51) Int. Cl.
*G11C 11/00* (2006.01)
*G11C 8/10* (2006.01)
*G11C 16/24* (2006.01)
*G11C 16/26* (2006.01)
*G11C 16/08* (2006.01)
*G11C 16/06* (2006.01)
*G11C 7/00* (2006.01)

(52) U.S. Cl.
CPC *G11C 8/10* (2013.01); *G11C 16/24* (2013.01); *G11C 16/26* (2013.01); *G11C 7/00* (2013.01); *G11C 16/08* (2013.01); *G11C 11/00* (2013.01); *G11C 16/06* (2013.01)

(58) Field of Classification Search
CPC ............ G11C 8/10; G11C 7/00; G11C 11/00; G11C 16/06; G11C 16/08; G11C 16/24; G11C 16/26
USPC ...................... 365/163, 230.06, 189.011, 148
See application file for complete search history.

(56) References Cited

U.S. PATENT DOCUMENTS

| 5,428,568 | A | * | 6/1995 | Kobayashi et al. ...... 365/185.24 |
| 5,856,940 | A | | 1/1999 | Rao |
| 5,909,400 | A | | 6/1999 | Bertin et al. |
| 6,356,503 | B1 | | 3/2002 | Roy |
| 6,661,695 | B2 | | 12/2003 | Fisch |
| 6,895,452 | B1 | | 5/2005 | Coleman et al. |
| 2003/0136967 | A1 | * | 7/2003 | Suda et al. ........................ 257/80 |
| 2005/0057997 | A1 | * | 3/2005 | Mitani et al. .................. 365/222 |

* cited by examiner

*Primary Examiner* — Toan Le
(74) *Attorney, Agent, or Firm* — Dicke, Billig & Czaja, PLLC (57) ABSTRACT

Decoding and decoder circuits in memory devices are disclosed. Array lines are biased or floated as memory device operations are performed in the memory device. In at least one embodiment, a decoder circuit includes complementary devices to bias array lines or float array lines in a memory device while particular memory device operations are performed.

32 Claims, 7 Drawing Sheets

FIG. 1

BACKGROUND ART

COMPLEMENTARY DECODING FOR NON-VOLATILE MEMORY

TECHNICAL FIELD

The present disclosure relates generally to memory and in particular, in one or more embodiments, the present disclosure relates to complementary bias circuitry in memory devices.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), phase change memory (PCM) and Flash memory.

Non-volatile memory is memory that can retain its stored data for some extended period without the application of power. Flash memory devices have developed into a popular source of non-volatile memory for a wide range of electronic applications. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Flash memory devices typically require relatively large voltages for programming and erasing operations. For example, a Flash memory device may have a supply voltage (e.g., Vcc) of 3V but require a voltage (e.g., Vpgm) of 15V or higher to be used during programming and/or erase operations on the array of memory cells. However, a sense (e.g., read) operation of Flash memory might only require voltages of Vcc or less, for example.

PCM is a resistive memory technology that can provide non-volatile storage but has the potential of relatively faster operation compared to flash memory. PCM, as the name implies, uses the change in resistance of a material when it changes phase in order to store data in a non-volatile manner. For example, an alloy of different elements might change from a crystalline phase having a low resistance to an amorphous phase having a high resistance. If the material could exhibit multiple distinctly different resistances, each different resistance can then be assigned a respective data value (e.g., 00, 01, 10, 11).

The phase change in PCM is brought about by heating the phase change material of each memory cell when it is addressed. This can be accomplished by a heater for each memory cell. When the heater is enabled by a current, it heats a chalcogenide alloy (e.g., germanium, antimony and tellurium (GeSbTe) or GST). When GST is heated to a relatively high temperature (e.g., over 600° C.), its chalcogenide crystallinity is lost. The GST cools into an amorphous glass-like state having a high electrical resistance. By heating the chalcogenide alloy to a temperature above its crystallization point but below the melting point it will transform back into a crystalline state having a lower electrical resistance.

The demand for higher operating speeds and greater storage capacity in memory devices continues to increase. This demand is accompanied by a need for a reduction in the latency of signals propagating within memory devices in order to facilitate the desired increase in operating speed. The latency of these signals can be cumulative and undesirable in light of the demand for reducing overall latency in memory devices. One source of latency in memory devices is circuitry (e.g., circuit(s)) which are commonly referred to as decoder circuits. These decoder circuits introduce delays (e.g., increase signal latency) as these signals propagate through one or more levels (e.g., layers) of decoder circuits in a memory device.

For the reasons stated above, and for other reasons stated below which will become apparent to those skilled in the art upon reading and understanding the present specification, there is a need in the art for decoder circuits which facilitate a reduction in the delay of signals propagating within memory devices.

DETAILED DESCRIPTION

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. In NOR Flash architecture, a logical column of memory cells is coupled in parallel with each memory cell coupled to a data line, such as those typically referred to as digit (e.g., bit) lines. In NAND Flash architecture, a column of memory cells is coupled in series with only the first memory cell of the column coupled to a bit line. Control gates of memory cells comprising a row of memory cells are coupled to (and in some cases at least partially form) access lines, such as those typically referred to as word lines. Data lines and/or word lines might be referred to as array lines as they facilitate access to the memory cells of an array of memory cells.

In a typical Flash memory array, each selected memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicate a different state. Multiple level cells can take advantage of the analog nature of a traditional charge storage cell by assigning a bit pattern to a specific $V_t$ range.

Figure 1:
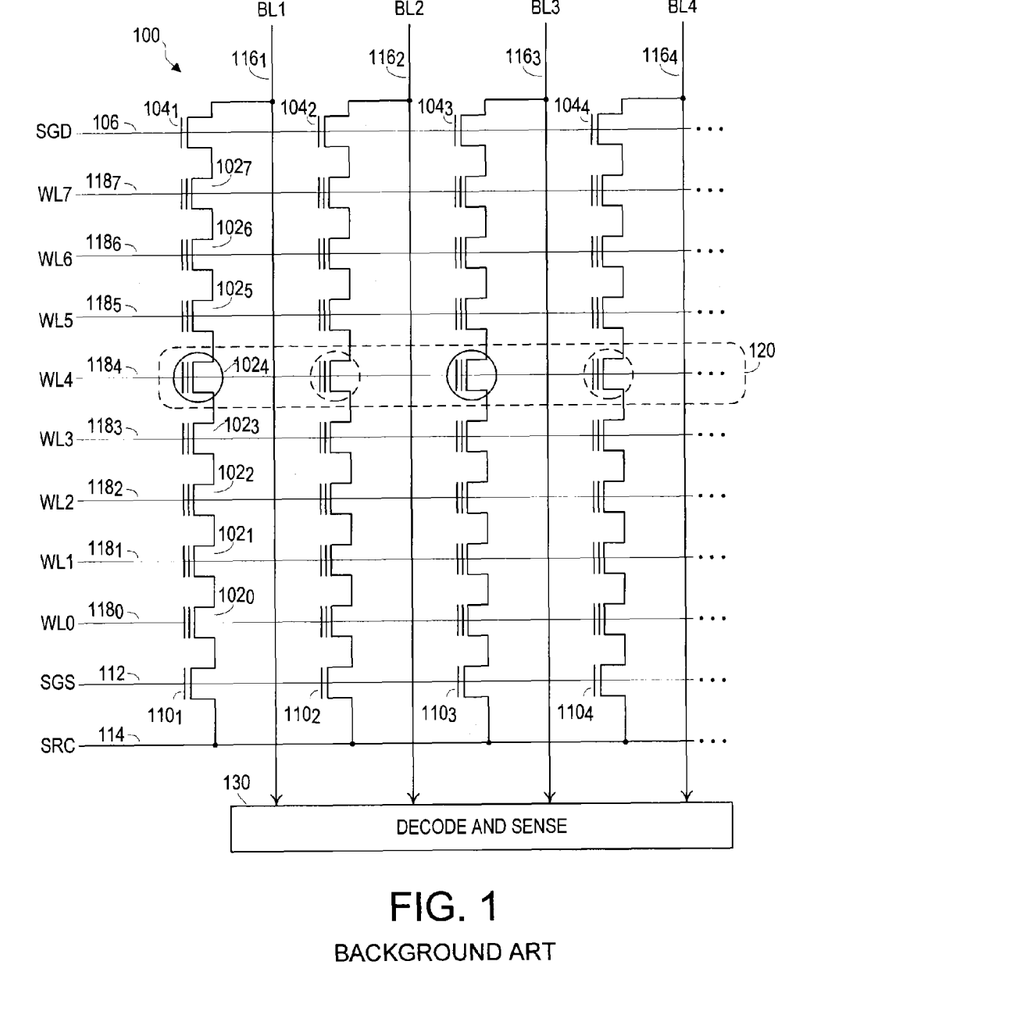
FIG. 1 illustrates a schematic representation of an array of NAND configured memory cells.

FIG. 1 illustrates a schematic representation of a NAND architecture memory array 100 wherein charge storage memory cells 102 of the memory array 100 are logically arranged in an array of rows and columns. In a conventional NAND architecture, "rows" typically refers to two or more memory cells having commonly coupled control gates, while "columns" typically refers to memory cells coupled as one or more NAND strings of memory cells 102, for example. The strings (e.g., NAND strings) of memory cells 102 of the memory array 100 each typically comprise 8, 16, 32, or more memory cells. Memory cells 102 of a string are connected together in series, source to drain, between a source line 114 and a data line 116, often referred to as a bit line. Each string of memory cells 102 is coupled to source line 114 by a source select gate, such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106. The one or more strings of memory cells 102 of a memory array 100 are typically arranged in groups (e.g., blocks) of memory cells.

The memory array 100 is accessed by a string driver (not shown) configured to activate a row of memory cells by selecting a particular array line (e.g., word line) 118, such as WL7-WL0 $118_{7-0}$, for example. Each word line 118 is coupled to the control gates of a row of memory cells 120. Bit lines BL1-BL4 $116_1$-$116_4$ can be biased to a particular potential depending on the type of operation being performed on the array, such as a sense, program or erase operation, for example. Bit lines BL1-BL4 116 are coupled to decoder and sense circuitry 130 which comprise sense devices (e.g., sense amplifiers) that detect the data state of each cell by sensing voltage or current on a particular bit line 116. The number of word lines and/or bit lines might be much greater than those shown in FIG. 1, without departing from the scope of the disclosure.

Programming typically involves applying one or more programming pulses (Vpgm) to a selected word line 118, such as WL4 $118_4$, and thus to the control gates of the row of memory cells 120 coupled to the selected word line $118_4$. Typical programming pulses (Vpgm) may start at or near 15V and tend to increase in magnitude during each subsequent programming pulse application. While the program potential (e.g., programming pulse) is applied to the selected word line $118_4$, a potential, such as a ground potential (e.g., 0V), may be applied to the substrate, and thus to the channels of these memory cells, resulting in a charge transfer from the channel to the charge storage structures of memory cells targeted for programming. For example, floating gates are typically charged through direct injection or Fowler-Nordheim tunneling of electrons from the channel to the floating gate, resulting in a Vt typically greater than zero in a programmed state. In the example of FIG. 1, a potential is applied to one or more unselected word lines $118_{7-5}$ and $118_{3-0}$. This potential might be 10V, for example. The potential applied to each unselected word line might be different potentials. A word line adjacent to the selected word line might be biased to a potential of 8V and the next adjacent word line might be biased to 7V, for example. These potentials are not high enough to cause programming of the unselected memory cells. One or more additional unselected word lines might be biased to a potential such as to 0V.

An inhibit potential (e.g., Vcc) is typically applied to bit lines 116 which are not coupled to a NAND string containing a memory cell 102 that is targeted for programming During a programming operation, alternate bit lines 116 may be enabled and inhibited from programming. Even numbered bit lines 116 (e.g., $116_2$, and $116_4$) might be enabled for programming of memory cells coupled to even numbered bit lines $116_{2,4}$ while the odd numbered bit lines 116 (e.g., $116_1$ and $116_3$) are inhibited from programming memory cells coupled to the odd numbered bit lines. A subsequent programming operation might then inhibit the even numbered bit lines 116 and enable the odd numbered bit lines 116. The memory cells 102 of row 120 having solid line circles are selected for programming whereas the memory cells 102 having dashed line circles are inhibited from programming as shown, for example.

Between the application of one or more programming (e.g., Vpgm) pulses, a verify operation is typically performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse Vpgm is applied if there are memory cells that have not completed programming. This process of applying a programming pulse followed by performing a verify operation typically continues until all the selected memory cells have reached their intended programmed states. If a particular number of programming pulses (e.g., maximum number) have been applied and one or more selected memory cells still have not completed programming, those memory cells might be marked as defective, for example.

Figure 2:
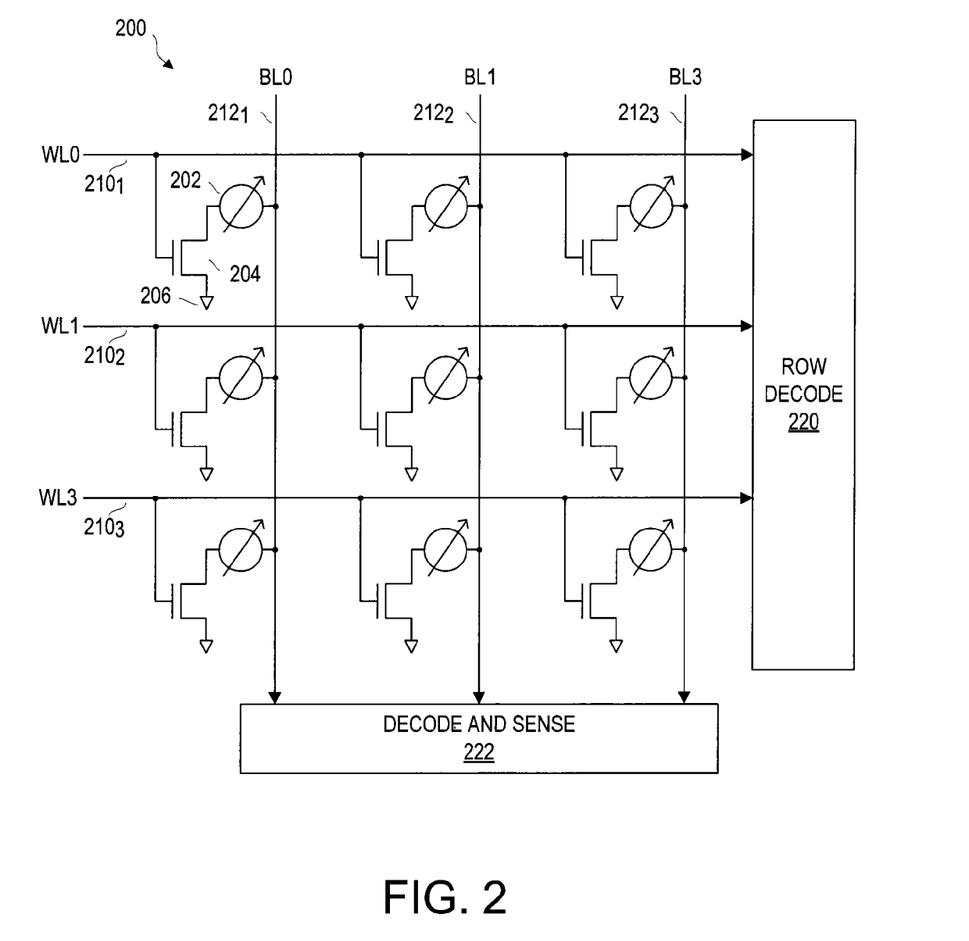
FIG. 2 illustrates a schematic representation of an array of phase change memory cells.

FIG. 2 illustrates a schematic representation of an array of phase change memory (PCM) cells 200. Access to the array of memory cells 200 might be facilitated by array lines of the memory array, such as access (e.g., word) lines WL0-WL3 210 and/or data lines BL0-BL3 212, for example. The number of array lines (e.g., word lines 210 and/or data lines 212) might be much greater than those shown in FIG. 2, without departing from the scope of the disclosure.

PCM uses a reversible process of changing the state of an alloy containing one or more elements from Group V or VI of the periodic table between amorphous and crystalline states upon application of an electric current, and wherein the (at least) two states have substantially different electrical resistance. Thus, PCM cells might be sensed (e.g., read) by measuring their resistance, for example. Typical current phase change memories use a chalcogenide alloy, such as a Germanium-Antimony-Tellurium (GeSbTe, or GST, most commonly $Ge_2Sb_2Te_5$) alloy. The amorphous (a-GST) and crystalline (c-GST) states of the material have largely different resistivity, on the order of three orders of magnitude, so that a determination of the state is easily done. The crystalline state has typical resistance on the order of kilo Ohms (Ku$\Omega$), whereas the amorphous state has typical resistance on the order of mega Ohms (M$\Omega$). These states are stable under normal conditions, so the PCM cell is a non-volatile cell with a long data retention. When the GST is in its amorphous state, it is said to be RESET. When the GST is in its crystalline state, it is said to be SET. PCM does not require an erase operation to be performed prior to performing a write operation.

The PCM array 200 includes a number of memory cells, each including a select device 204 coupled to a resistive storage element 202. The select devices 204 can include, for example, field effect transistors (FETs), such as MOSFETs, or bipolar junction transistors (BJTs), or diodes. The select device 204 is shown as a three terminal FET where the gate of each select device 204 is coupled to one of a number of access lines (e.g., word lines) WL0-WL3 210. Each word line WL0-WL3 210 is coupled in such a fashion to its respective row of memory cells. A second terminal of each FET is coupled to its respective resistive storage element 202. A third terminal of each FET is coupled to a circuit common reference 206. Each resistive storage element 202 is also coupled to a respective data line (e.g., bit line) BL0-BL3 212. Each bit line BL0-BL3 212 is coupled to its respective column of memory cells.

The word lines WL0-WL3 210 are coupled to one or more access (e.g., row) decoders 220 that are used to selectively access the word lines. The bit lines BL0-BL3 212 are coupled to the decode and sense circuitry 222, through a decoder hierarchy (not shown), that senses either a voltage or a current in order to determine the programmed state of the respective memory cells that have been accessed by a word line.

Programming PCM involves applying one or more programming pulses to bit lines coupled to selected memory cells. The shape of these programming pulses can affect whether a selected PCM cell is being 'set' or 'reset.' For example, a programming pulse which exhibits a rapid decrease on the falling edge of the pulse might be generated to facilitate programming the selected PCM cell to a first state. A programming pulse exhibiting a slower controlled decay of the falling edge of the pulse might be generated to facilitate programming the selected PCM cell to a different state, for example.

Figure 3:
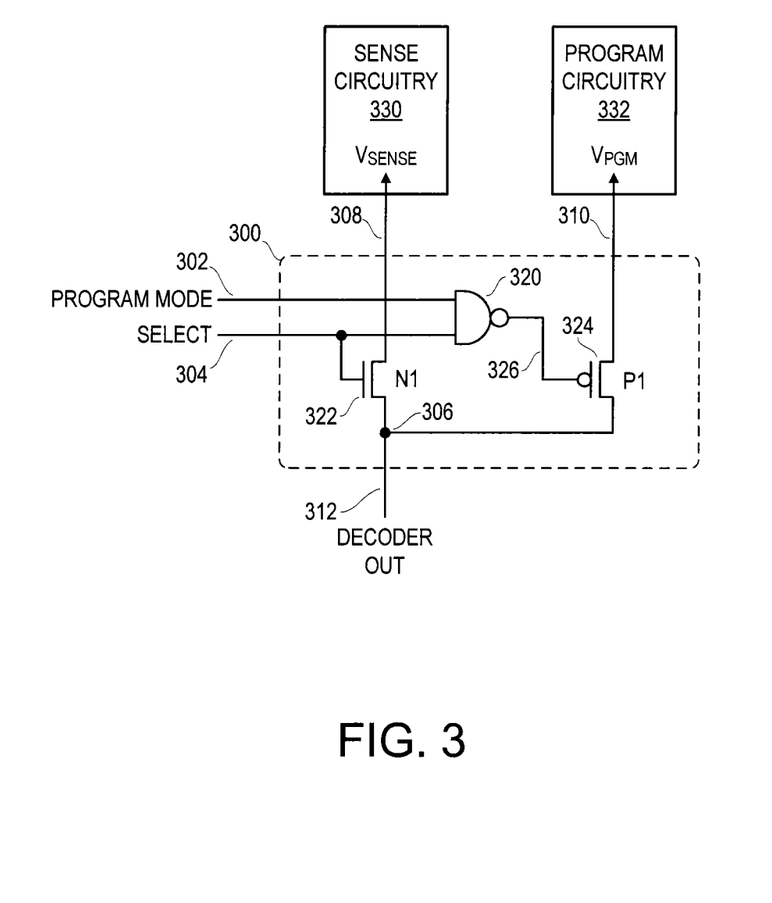
FIG. 3 is a schematic representation of decoder circuitry according to an embodiment of the present disclosure.

FIG. 3 illustrates a schematic diagram of a decoder circuit 300 according to one or more embodiments of the present disclosure. The decoder circuit 300 comprises a first gate N1, such as a transistor 322, and a second gate P1, such as transistor 324. According to various embodiments, transistor N1 322 might comprise an n-type field effect transistor and transistor P1 324 might comprise a p-type field effect transistor.

Decoder circuit 300 further comprises a third gate (e.g., logic gate) 320, such as a two-input NAND gate, for example. A first input of the NAND gate 320 is coupled to a signal line PROGRAM MODE 302. A second input of the NAND gate 320 is coupled to a signal line SELECT 304. It should be noted that various embodiments of the present disclosure are not limited to comprising NAND gate circuits. Other logic gate circuits might facilitate activating and/or deactivating transistors of complementary pairs of transistors according to one or more embodiments, for example.

A control gate of transistor N1 322 is coupled to the second input of the NAND gate 320 and the SELECT signal line 304. The control gate of the second transistor P1 324 is coupled to the output of the NAND gate 320 by signal line 326. A source/drain region of the first transistor N1 322 and the second transistor P1 324 are commonly coupled to create node 306 which further comprises a DECODER OUT signal line 312. A second source/drain region of transistor N1 322 is coupled to SENSE CIRCUITRY 330 by signal line 308. A second source/drain region of transistor P1 324 is coupled to PROGRAM CIRCUITRY 332 by signal line 310. Thus, decoder circuits according to various embodiments might be configured to couple sense voltages to a memory array with a first type of transistor (e.g., n-type) and to couple program voltages to the array of memory cells with a second type of transistor (e.g., p-type) to reduce latency in decoder circuits, for example. Transistor devices other than field effect transistors are known and might be configured in a complementary configuration such as shown in FIG. 3 according to various embodiments of the present disclosure.

The DECODER OUT signal line 312 might be coupled to one or more data lines (not shown in FIG. 3) of a PCM array, such as one or more data lines BL1-BL3 112 shown in FIG. 2, for example. The DECODER OUT signal line 312 might be coupled to one or more word lines (not shown in FIG. 3) of a NAND flash array, such as one or more word lines 118 shown in FIG. 1. Referring again to FIG. 3, the DECODER OUT signal line 312 might be coupled to one or more array lines of a memory array through one or more additional levels (e.g., intermediate levels) of decoder circuitry (not shown in FIG. 3) according to various embodiments of the present disclosure.

Table 1 illustrates operational characteristics of a decoder circuit, such as decoder circuit 300 shown in FIG. 3, according to various embodiments of the present disclosure. Control circuitry of a memory device (not shown) comprising one or more decoder circuits 300 might be configured to provide (e.g., apply, bias, generate, supply, etc.) signals, such as the SELECT 304 and PROGRAM MODE 302 signals. These signals might be provided responsive to a particular operating mode of the memory device, such as sense (e.g., read), write and erase operations to be performed, for example.

TABLE 1

| SELECT | PROGRAM MODE | N1 | P1 | DECODER OUT |
|--------|--------------|-----|-----|----------------|
| LOW    | X            | OFF | OFF | HIGH IMPEDANCE |
| LOW    | X            | OFF | OFF | HIGH IMPEDANCE |
| HIGH   | LOW          | ON  | OFF | VSENSE         |
| HIGH   | HIGH         | ON  | ON  | VPGM           |

X = Don't care.

One or more decoder circuits comprising a memory device might be deselected by biasing the SELECT signal line of the deselected decoder circuits to a logic low level. In this mode, both the N1 322 and P1 324 transistors of the deselected decoder circuits are deactivated (i.e., off) Thus, node 306, and the DECODER OUT signal is in a high impedance (e.g., floating) state. Thus, a DECODER OUT signal line 312 of a decoder circuit 300 according to various embodiments of the present disclosure might be a high impedance state. This condition might be desirable when an array line (e.g., unselected data line) coupled to the decoder circuit does not comprise a memory cell selected for programming during a program operation performed in the memory device, for example. This is in contrast to typical complementary circuits wherein one of the complementary devices is activated and one is deactivated. Thus, the common node between the two devices (e.g., transistors) in a typical complementary circuit is biased to either a first level (e.g., ground) or a second level (e.g., Vcc.)

Referring again to Table 1, during a sense (e.g., read) operation performed in a memory device according to one or more embodiments, transistor N1 322 is activated (i.e., on) and the DECODER OUT signal line 312 might be biased to a Vsense potential provided by the SENSE CIRCUITRY 330, for example. During a program operation performed in a memory device according to one or more embodiments, transistor P1 324 might be activated and the DECODER OUT signal line 312 coupled to a selected array line might be biased to a Vpgm potential provided by the PROGRAM CIRCUITRY 332, for example.

Figure 4:
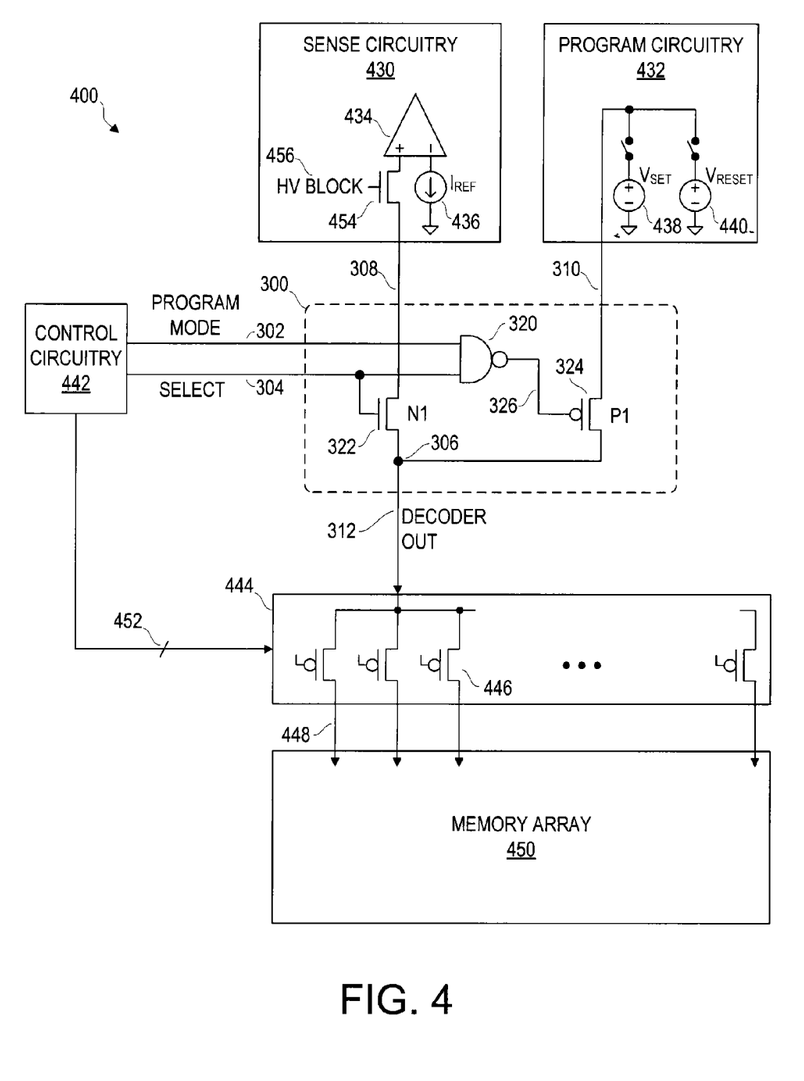
FIG. 4 is a schematic representation of a portion of a memory device according to an embodiment of the present disclosure.

FIG. 4 illustrates a schematic diagram of a portion of a memory device 400 comprising a decoder circuit 300 such as shown in FIG. 3 according to various embodiments of the present disclosure. The memory device 400 comprises an array of memory cells 450. The array of memory cells 450 might comprise an array of Flash memory cells having a NAND configuration or a NOR configuration, for example. One or more embodiments might comprise a PCM memory array 450. Only one decoder circuit 300 is shown in FIG. 4. However, various embodiments are not so limited. A memory device 400 might comprise many decoder circuits 300 configured into one or more levels (e.g., tiers) of decoders. For example, each decoder circuit 300 comprising a particular tier of decoders might be configured to be coupled to groups of array lines of the memory device. Each decoder circuit 300 might be selectively coupled to a particular data line of groups of 32 data lines of the memory device, for example.

Memory device control circuitry 442 is configured to control one or more memory device operations within the memory device 400, such as sense, program and/or erase operations in the memory array 450, for example. The control circuitry 442 is coupled to the decoder circuit 300 and is configured to bias the PROGRAM MODE 302 and SELECT 304 signal lines such as discussed above with respect to FIG. 3 and Table 1.

Sense circuitry 430 might correspond to the sense circuitry 330 shown in FIG. 3. The sense circuitry 430 may be configured to provide a Vsense potential such as described above with respect to Table 1. Sense circuitry 430 might comprise circuitry configured to facilitate sensing operations in the memory device, such as a comparator 434 and a current reference circuit 436, for example. According to one or more embodiments, sense circuitry 430 might comprise a gate 454 which can be selectively activated and deactivated by an HV BLOCK signal 456. The HV BLOCK signal 456 might be provided by control circuitry 442, for example. Gate 454 might be activated concurrently with gate N1 322 during a sense operation performed in the memory device 400. Gate 454 might be deactivated during a program operation when gate N1 322 and gate P1 324 are concurrently activated to block a program voltage supplied by program circuitry 432 from being coupled to various components of the sense circuitry 430, for example. Although not shown in FIG. 4, sense circuitry 430 might comprise additional circuitry to provide particular voltages (e.g., one or more voltage sources) to facilitate sensing operations according to various embodiments.

Program circuitry 432 might correspond to the program circuitry 332 discussed above with respect to FIG. 3 and be configured to provide a Vpgm potential. For example, program circuitry 432 might comprise multiple voltage generators (e.g., pulse generators), such as a Vset 438 and a Vreset 440 voltage generator to facilitate programming in a memory device comprising PCM memory, for example.

The DECODER OUT signal line 312 might be coupled to one or more array lines 448 of the memory array 450 according to various embodiments of the present disclosure. The array lines 448 might comprise the data lines 212 of a PCM array such as shown in FIG. 2. According to one or more embodiments, the array lines 448 might comprise the access lines 118 of a NAND array of memory such as shown in FIG. 1, for example. According to one or more embodiments, the DECODER OUT signal lines 312 might be coupled to the array lines 448 of memory array 450 through one or more different levels of decoders 444. These decoders 444 might comprise one or more gates 446 configured to selectively couple a particular DECODER OUT signal line 312 to one of a plurality of array lines (e.g., sometimes referred to as fan-out) 448 of the memory array 450. For example, each DECODER OUT signal line 312 of the memory device 400 might be selectively coupled to 1 of 32 array lines (e.g., 1-to-32 fan-out) of the memory array 450, for example.

The one or more levels of decoders (e.g., intermediate decoders) 444 between the decoder circuitry 300 and the memory array 450 might comprise individual gates which can be selectively activated, such as p-type transistors 446, to facilitate coupling a particular DECODER OUT signal line 312 to one of a plurality of array lines 448 of the memory array 450. The control circuitry 442 might be configured to selectively activate each of the gates 446 by selectively biasing a number of signal lines 452. The number of signal lines 452 might comprise a single or a plurality of signal lines (e.g., a bus). Each signal line of signal lines 452 is coupled to a control gate of each gate 446 (not shown in FIG. 4) to selectively activate each gate 446 to facilitate a decode operation between the memory array 450 and the one or more decoder circuits 300, for example.

The complementary transistor pair of gates N1 322 and P1 324 of decoder circuit 300 might facilitate a reduction in the latency of decoding performed by decoder circuits 300 according to various embodiments of the present disclosure. By way of example, an overall operating voltage range utilized in accessing the memory array 450 (e.g., as supplied by sense circuitry 430 and program circuitry 432) might comprise 4.5V to −2V. Thus, the individual gates 446 of the intermediate level decoders 444 might use an applied bias of 4.5V to −2V to facilitate a full selection/deselection of those gates 446 during a sense and/or program operation, for example. In contrast, the complementary transistor pairs of N1 322 and P1 324 of decoder circuits 300 might need applied bias levels of 4.5V to 0V to activate/deactivate those gates. Thus, a reduction in selection/deselection time to perform a decode operation (e.g., reduced signal latency) might be realized as a smaller voltage transition is used to facilitate decode operations in decoder circuits 300. Although shown as individual gates 446 in FIG. 4, the intermediate level decoders 444 might comprise a plurality of decoder circuits, such as a plurality of decoder circuits 300 according to various embodiments of the present disclosure, for example. Thus, memory device 400 might comprise multiple levels of decoders where each level comprises one or more instances of decoder circuitry 300, for example.

Figure 5:
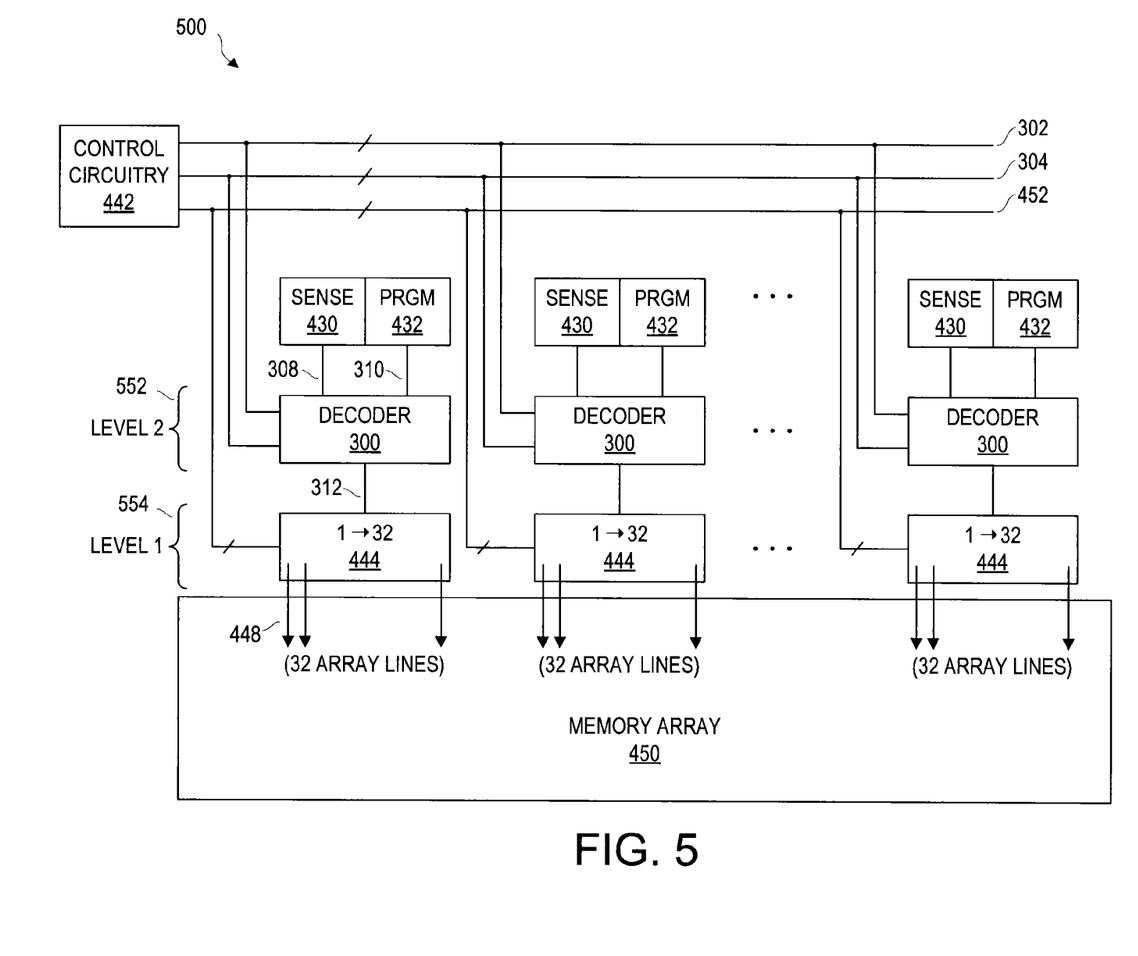
FIG. 5 is a schematic representation of a portion of a memory device according to an embodiment of the present disclosure.

FIG. 5 illustrates a portion of a memory device 500 comprising multiple levels of decoders according to various embodiments of the present disclosure. FIG. 5 further illustrates multiple instances of decoders such as discussed above and shown in FIG. 4, for example. A first level of decoders, such as LEVEL 1 554, comprises a plurality of groups of decoders 444. Each group of decoders 444 might be configured to selectively couple each decoder output signal 312 to 1 of 32 array lines 448 of the memory array 450 coupled to each decoder group 444. The LEVEL 1 decoders 554 might be referred to as an intermediate level of decoders, for example.

FIG. 5 further illustrates a second level of decoders, such as LEVEL 2 552, where each might comprise decoder circuitry 300 coupled to sense 430 and program 432 circuitry such as discussed above and shown in FIG. 4. Thus, a decoder output signal 312 of each decoder 300 shown in FIG. 5 might be selectively coupled to one of 32 array lines 448 of the memory array 450 by each decoder group 444. The LEVEL 1 554 and LEVEL 2 552 levels of decoder circuitry might comprise a decoder hierarchy discussed above with respect to FIG. 2, for example. It should be noted that various embodiments of the present disclosure are not limited to decoding 1 to 32 array lines such as shown in FIG. 5. FIG. 5 further illustrates that control circuitry 442 is coupled to the various decoder circuitry 300/444 by signal lines 302, 304 and 452, such as discussed above with respect to FIG. 4, for example. One or more signal lines 302, 304 and 452 might comprise a plurality of signal lines (e.g., bus).

Figure 6:
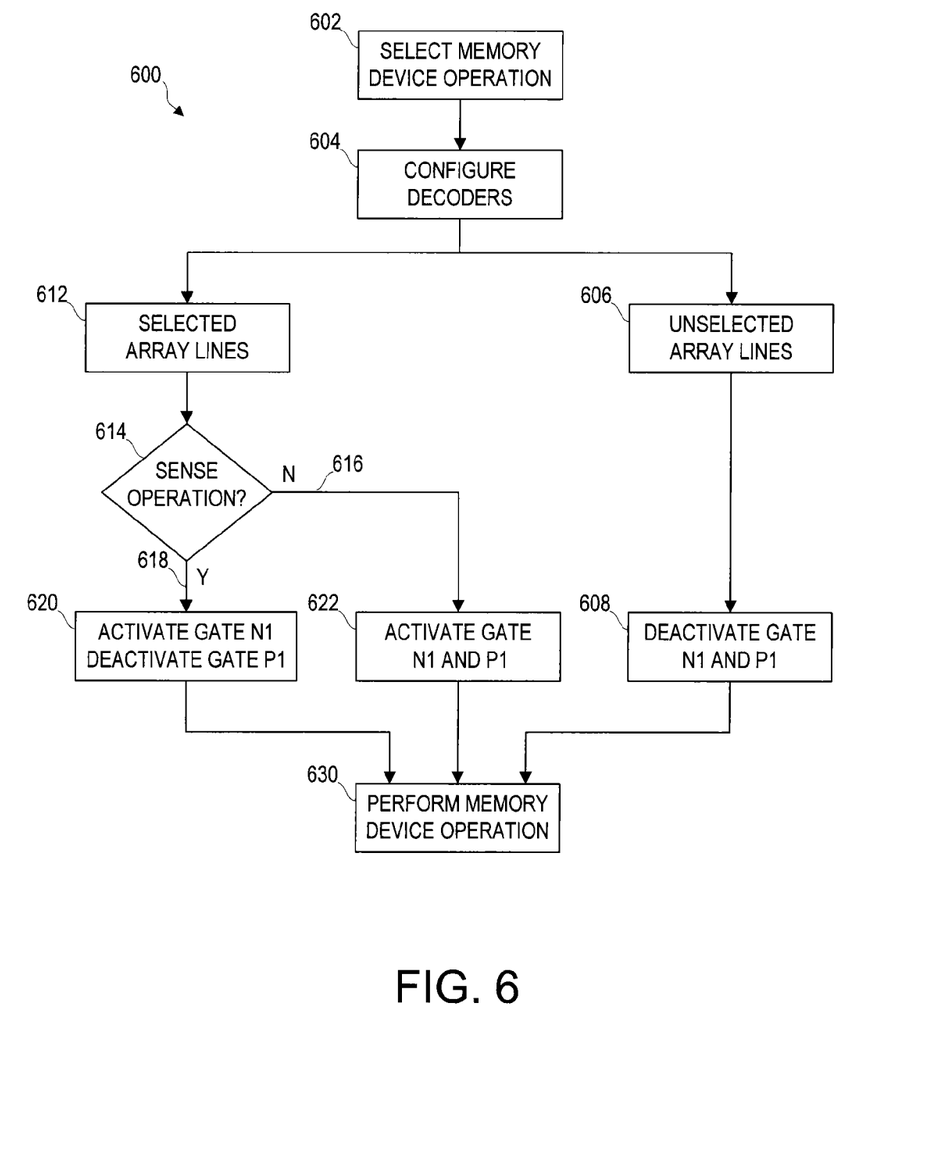
FIG. 6 illustrates a flowchart of configuring decoder circuits in a memory device according to an embodiment of the present disclosure.

FIG. 6 illustrates a flow chart 600 of a method of configuring decoder circuits, such as decoder circuit 300 shown in FIGS. 3, 4 and 5, to facilitate performing a memory device operation in a memory device according to various embodiments of the present disclosure. A memory device operation to be performed is selected 602, such as a sense or a program operation, for example. One or more decoders are configured 604 responsive to the particular memory device operation to be performed. One or more array lines of the memory device (e.g., array lines 448 shown in FIG. 4) might be unselected if those array lines are not coupled to memory cells selected for the particular memory device operation. Decoder circuits coupled to unselected array lines 606 might be configured by deactivating 608 (e.g., concurrently deactivating) the N1 322 and P1 324 gates, such as discussed above with respect to Table 1. Thus, the DECODER OUTPUT signal lines 312 of the decoder circuits coupled to unselected array lines might be in a high impedance state while a memory device operation is performed according to various embodiments of the present disclosure.

Decoder circuits coupled to selected array lines 612 (e.g., array lines coupled to selected memory cells) are configured along with (e.g., concurrently with) configuring decoder circuits coupled to unselected array lines 606 discussed above, for example. A determination might be made 614 to determine if the selected memory device operation is a sense operation. When a sense operation has been selected 618, one gate of the decoder circuits 300 might be activated and one gate might be deactivated 620. Thus, gate N1 322 might be activated and gate P1 324 might be deactivated 620 in a decoder circuit coupled to a selected array line during a sense operation, such as discussed above with respect to Table 1, for example. When the selected operation is not a sense operation 616, such as if a program operation has been selected, both the N1 gate 322 and P1 gate 324 of decoder circuits 300 coupled to the selected array lines might be activated 622 to facilitate the program operation. Control circuitry of the memory device might facilitate performing the selected memory device operation 630 following the configuration of the decoder circuits coupled to selected array lines 612 and unselected array lines 606.

Figure 7:
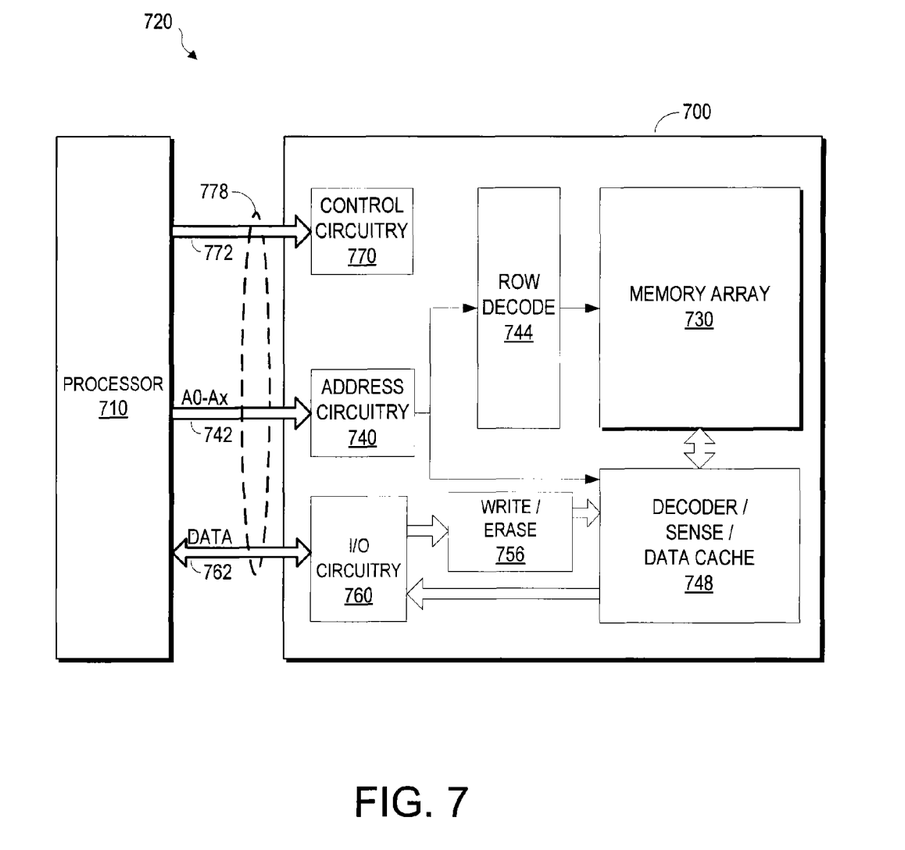
FIG. 7 is a simplified block diagram of a memory device coupled to a memory access device as part of an electronic system according to an embodiment of the present disclosure.

FIG. 7 is a functional block diagram of an electronic system having at least one apparatus, such as a memory device 700, according to one or more embodiments of the present disclosure. The memory device 700 illustrated in FIG. 7 is coupled to a memory access device, such as a processor 710. The processor 710 may be a microprocessor or some other type of controlling circuitry. The memory device 700 and the processor 710 form part of an electronic system 720. The memory device 700 has been simplified to focus on features of the memory device that are helpful in understanding various embodiments of the present disclosure.

The memory device 700 includes one or more memory arrays 730 that might be logically arranged in rows and columns. According to one or more embodiments, the memory cells of memory array 730 are flash memory cells. The memory array 730 might include multiple banks and blocks of memory cells residing on a single or multiple die as part of the memory device 700. Memory array 730 might comprise Single Level Cell and/or Multilevel Cell memory. According to one or more embodiments, the memory array 730 might comprise a PCM memory array.

An address buffer circuit 740 is provided to latch address signals provided on address input connections A0-Ax 742. Address signals are received and decoded by a row decoder 744 and a column decoder 748 to access the memory array 730. Row decoder 744 might comprise driver circuitry configured to bias the word lines of the memory array 730, for example. It will be appreciated by those skilled in the art, with the benefit of the present description, that the number of address input connections 742 might depend on the architecture of the memory array 730. That is, the number of address digits increase with both increased memory cell counts and increased bank and block counts, for example.

The memory device 700 reads data in the memory array 730 by sensing voltage or current changes in the memory array columns using sense devices, such as decoder/sense/data cache circuitry 748. The decoder/sense/data cache circuitry 748, in at least one embodiment, is coupled to read and latch a row of data from the memory array 730. The decoder/sense/data cache circuitry 748 might comprise one or more decoder circuits according to various embodiments, such as described above with respect to FIGS. 3, 4 and 5 and Table 1, for example. Data input and output (I/O) buffer circuitry 760 is included for bi-directional data communication over a plurality of data connections 762 with the processor 710. Write/erase circuitry 756 is provided to write data to or to erase data from the memory array 730.

Control circuitry 770 is configured, at least in part, to facilitate implementing various embodiments of the present disclosure. Control circuitry 770 might be coupled (not shown in FIG. 7) to one or more of the elements of the memory device 700. For example, the control circuitry might be coupled to the row decoder 744 and configured to cause the row decoder driver circuitry to bias particular word lines of the memory array 730 according to various embodiments of the present disclosure. Control circuitry 770 might be coupled (not shown in FIG. 7) to and configured to cause the decoder/sense/data cache circuitry 748 to bias particular bit lines of the array 730 according to one or more embodiments. In one or more embodiments, control circuitry 770 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. In at least one embodiment, the control circuitry 770 may utilize a state machine.

Control signals and commands can be sent by the processor 710 to the memory device 700 over the command bus 772. The command bus 772 may be a discrete signal or may be comprised of multiple signals, for example. These command signals 772 are used to control the operations on the memory array 730, including data read, data write (e.g., program), and erase operations. The command bus 772, address bus 742 and data bus 762 may all be combined or may be combined in part to form a number of standard interfaces (e.g., communications interfaces) 778. For example, the interface 778 between the memory device 700 and the processor 710 might be a Universal Serial Bus (USB) interface. The interface 778 might also be a standard interface used with many hard disk drives (e.g., SATA, PATA) as are known to those skilled in the art.

The electronic system illustrated in FIG. 7 has been simplified to facilitate a basic understanding of the features of the memory and is for purposes of illustration only. A more detailed understanding of internal circuitry and functions of non-volatile memories are known to those skilled in the art.

CONCLUSION

Memory devices having complementary decoder circuitry and methods of operating such memory devices have been described. In particular, non-volatile memory devices comprising complementary decoder circuitry, for example might be operable to facilitate a reduction in signal latency in memory devices comprising such circuitry. The complementary decoder circuitry might be configured to bias array lines and/or float array lines while memory device operations are performed within the memory device.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. An apparatus, comprising:
 a first transistor having a control gate coupled to a first voltage, wherein when the first transistor is configured to a low impedance state the first transistor couples a portion of a memory array to a sensing circuit; and
 a second transistor having a control gate coupled to a logic gate combining the first voltage and a second voltage, wherein when the second transistor is configured to a low impedance state the second transistor couples a portion of the memory array to a programming circuit;
 wherein the first transistor and the second transistor comprise different types of transistors.

2. The apparatus of claim 1, wherein the first voltage comprises a decoded selection voltage, and where the second voltage comprises a decoded program enable voltage.

3. The apparatus of claim 1, wherein the first transistor and the second transistor comprise a complementary pair of transistors.

4. The apparatus of claim 1, wherein the first transistor comprises an n-type field effect transistor and where the second transistor comprises a p-type field effect transistor.

5. The apparatus of claim 1, wherein the apparatus comprises a decoder circuit.

6. The apparatus of claim 1, further comprising:
 a first input node coupled to receive the first voltage;
 a second input node coupled to receive the second voltage;
 an output node, wherein the output node is coupled to provide in response to the first voltage and the second voltage one of a high impedance state, a sense voltage of the sensing circuit, and a program voltage of the programming circuit;
 wherein the logic gate circuit comprises a first input coupled to the first input node, a second input coupled to the second input node, and an output;
 wherein the first transistor is coupled between the sensing circuit and the output node, and where the control gate of the first transistor is coupled to the second input node; and
 wherein the second transistor is coupled between the second voltage source and the output node, and where the control gate of the second transistor is coupled to the logic gate circuit output.

7. The apparatus of claim 6, wherein the portion of the memory array is coupled to the first transistor and the second transistor by the output node.

8. The apparatus of claim 6, wherein the logic gate circuit comprises a NAND gate logic circuit.

9. The apparatus of claim 6, wherein the second transistor is deactivated responsive to at least one of the first input node and the second input node being at an inactive level.

10. The apparatus of claim 6, wherein the first transistor and the second transistor are activated responsive to the first input node and the second input node being concurrently at active levels.

11. The apparatus of claim 6, wherein the high impedance state comprises a floating state of the output node.

12. The apparatus of claim 1, wherein the apparatus comprises a memory device and where the memory device further comprises:
 an array of memory cells; and
 a controller configured to provide the first voltage and the second voltage, where the first voltage and the second voltage are provided in response to a particular operating mode of the apparatus.

13. The apparatus of claim 12, wherein the sensing circuit is configured to provide a sense voltage.

14. The apparatus of claim 12, wherein the programming circuit is configured to provide a program voltage.

15. The apparatus of claim 12, wherein the programming circuit is configured to provide a plurality of program voltages.

16. The apparatus of claim 12, wherein the controller is configured to concurrently activate the first and the second transistors.

17. The apparatus of claim 12, wherein the controller is further configured to concurrently deactivate the first and the second transistors.

18. The apparatus of claim 12, wherein the controller is configured to concurrently activate the first transistor and deactivate the second transistor.

19. The apparatus of claim 12, wherein the array of memory cells comprises one of an array an array of flash memory cells or an array of PCM memory cells.

20. The apparatus of claim 12, wherein the apparatus is configured to selectively couple the output node of the apparatus to one of a respective plurality of array lines of the memory device.

21. The apparatus of claim 20, wherein the plurality of array lines comprises one of a plurality of access lines or a plurality of data lines.

22. A memory device, comprising:
 an array of memory cells coupled to a plurality of array lines;
 a controller configured to provide a first input signal and a second input signal, the first input signal and the second input signal provided in response to a particular operating mode of the memory device;
 a first voltage source;
 a second voltage source; and
 a decoder circuit comprising:
  a first transistor having a control gate coupled to receive the first input signal, wherein when the first transistor is configured to a low impedance state the first transistor couples a portion of the array of memory cells to the first voltage source; and
  a second transistor having a control gate coupled to a logic gate combining the first input signal and the second input signal, wherein when the second transistor is configured to a low impedance state the second transistor couples the portion of the array of memory cells to the second voltage source;

wherein the first transistor and the second transistor comprise different types of transistors.

23. The memory device of claim 22, wherein the first voltage source comprises a sensing circuit and where the second voltage source comprises a programming circuit.

24. The memory device of claim 22, wherein the decoder circuit further comprises an output node coupled to a respective one of the plurality of array lines, where the output node is coupled to provide, in response to the first input signal and the second input signal, one of a high impedance state, a first voltage potential of the first voltage source, and a second voltage potential of the second voltage source.

25. The memory device of claim 24, further comprising a plurality of intermediate decoder circuits each decoder circuit coupled to a respective one of the plurality of data lines, wherein the controller is further configured to selectively activate each of the plurality of intermediate decoder circuits to couple the output node to a respective one of the plurality of array lines.

26. The memory device of claim 22, wherein the array of memory cells comprises one of an array of flash memory cell or phase change memory (PCM) memory cells.

27. The memory device of claim 22, wherein the controller is further configured to provide the first and the second input signal to concurrently deactivate the first and the second transistor and perform a program operation in the memory device.

28. The memory device of claim 22, wherein the controller is further configured to provide the first and the second input signal to concurrently activate the first and the second transistor and perform a program operation in the memory device.

29. The memory device of claim 22, wherein the controller is further configured to provide the first and the second input signal to concurrently activate the first transistor and to deactivate the second transistor and perform a sense operation in the memory device.

30. A method of operating a memory device having an array of memory cells coupled to a respective one of a plurality of array lines, the method comprising:

activating a first transistor coupled between a first voltage source and a first array line of the plurality of array lines and performing a sense operation on a first selected memory cell coupled to the first array line;

activating the first transistor and concurrently activating a second transistor coupled between a second voltage source and the first array line and performing a program operation on the second selected memory cell coupled to the first array line; and concurrently deactivating the first and the second transistor and performing a program operation and/or a sense operation on a second selected memory cell coupled to a second array line of the plurality of array lines;

wherein the first transistor comprises a different type of transistor than the second transistor.

31. The method of claim 30, further comprising providing a first control signal and providing a second control signal, wherein the first and the second transistors are selectively activated and/or deactivated responsive to a logic level of the first control signal and a logic level of the second control signal.

32. The method of claim 30, further comprising deactivating a third transistor coupled between the first transistor and the first voltage source when the first transistor and the second transistor are concurrently activated.

* * * * *

UNITED STATES PATENT AND TRADEMARK OFFICE
CERTIFICATE OF CORRECTION

PATENT NO. : 9,007,822 B2  Page 1 of 1
APPLICATION NO. : 13/616545
DATED : April 14, 2015
INVENTOR(S) : Nicholas Hendrickson It is certified that error appears in the above-identified patent and that said Letters Patent is hereby corrected as shown below:

In the Claims

Column 12, line 40, delete "an array an array" and insert in place thereof --an array--.

Signed and Sealed this
Ninth Day of February, 2016

Michelle K. Lee
*Director of the United States Patent and Trademark Office*